United States Patent
Yao et al.

(10) Patent No.: US 7,551,386 B2
(45) Date of Patent: Jun. 23, 2009

(54) HEAD GIMBAL ASSEMBLY WITH FLYING HEIGHT CONTROLLER, DISK DRIVE UNIT USING THE SAME, AND FLYING HEIGHT ADJUSTING METHOD AND SYSTEM THEREOF

(75) Inventors: MingGao Yao, DongGuan (CN); Masashi Shiraishi, HongKong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 44 days.

(21) Appl. No.: 10/965,783

(22) Filed: Oct. 18, 2004

(65) Prior Publication Data

US 2006/0082917 A1 Apr. 20, 2006

(51) Int. Cl.
*G11B 21/02* (2006.01)
*G11B 21/24* (2006.01)
(52) U.S. Cl. .................... 360/75; 360/78.05; 360/294.4
(58) Field of Classification Search ........................ None
See application file for complete search history.

(56) References Cited

U.S. PATENT DOCUMENTS

| | | | |
|---|---|---|---|
| 5,611,707 A | 3/1997 | Meynier | |
| 6,266,212 B1 * | 7/2001 | Coon | 360/234.5 |
| 6,538,836 B1 * | 3/2003 | Dunfield et al. | 360/75 |
| 6,617,763 B2 * | 9/2003 | Mita et al. | 310/328 |
| 6,624,984 B2 * | 9/2003 | Lewis et al. | 360/294.7 |
| 6,700,727 B1 * | 3/2004 | Crane et al. | 360/75 |
| 6,801,398 B1 * | 10/2004 | Ohwe et al. | 360/234.6 |
| 6,950,266 B1 * | 9/2005 | McCaslin et al. | 360/75 |
| 2006/0023338 A1 * | 2/2006 | Sharma et al. | 360/75 |

FOREIGN PATENT DOCUMENTS

JP 06103717 A * 1/1994

* cited by examiner

*Primary Examiner*—Jason C Olson
(74) *Attorney, Agent, or Firm*—Nixon & Vanderhye P.C.

(57) ABSTRACT

A HGA comprises a slider, a suspension to load the slider, a flying height controller for controlling flying height of the slider; and a flexible cable to be electrically connected with the slider and the flying height controller. In the present invention, the flying height controller comprises at least one piezoelectric piece disposed between the slider and the suspension. The HGA further comprises ACF to connect the flying height controller with the suspension and the flexible cable. The invention also discloses a disk drive unit with the HGA, a method for flying height control with the HGA, and a system for controlling flying height.

13 Claims, 12 Drawing Sheets

FIG. 1

(Prior Art)

FIG. 2

(Prior Art)

HEAD GIMBAL ASSEMBLY WITH FLYING HEIGHT CONTROLLER, DISK DRIVE UNIT USING THE SAME, AND FLYING HEIGHT ADJUSTING METHOD AND SYSTEM THEREOF

FIELD OF THE INVENTION

The present invention relates to head gimbal assemblies and disk drive units having a good flying height adjustment capability, and also relates to a method and system of adjusting flying height.

BACKGROUND OF THE INVENTION

A data storage system, such as disk drive, generally includes one or more magnetic disks which are rotated by a spindle motor at a constant speed, and one or more information storage heads (generally called "sliders") flying on the magnetic disk(s) to write data information to or read data information from the magnetic disks. The slider includes a bearing surface, such as an air bearing surface (ABS), which faces the disk surface. When the disk rotates, the air pressure between the disk and the ABS increases, which creates a hydrodynamic lifting force that causes the slider to lift and fly above the disk surface.

As is well known in the art, each of the sliders is mounted on a suspension which is supported by a drive arm (the suspension with the slider is generally called "head gimbal assembly", which is abbreviated to "HGA"). The drive arm is movable and controlled by a voice coil motor (VCM). However, a flying height (FH) of the slider is easy to vary due to the following reasons: 1. the high-speed rotation of the disk; 2. the tolerance of air bearing surface (ABS) of the slider; 3. the static attitude of the suspension. The variation of the flying height will greatly influence the performance of the disk drive. That is, if the flying height is too high, it will affect the slider reading data from or writing data to the disk; on the contrary, if the flying height is too low, the shock of the slider may scratch the disk so as to cause the damage of the slider and/or the disk. In today's disk drive industry, with the rapid increase of disk drive's capacity, the track pitch and the track width of disk drive become narrower and narrower, and accordingly the flying height of the slider becomes lower and lower, so controlling the dynamic flying height of the slider becomes more and more important.

Figure 1:
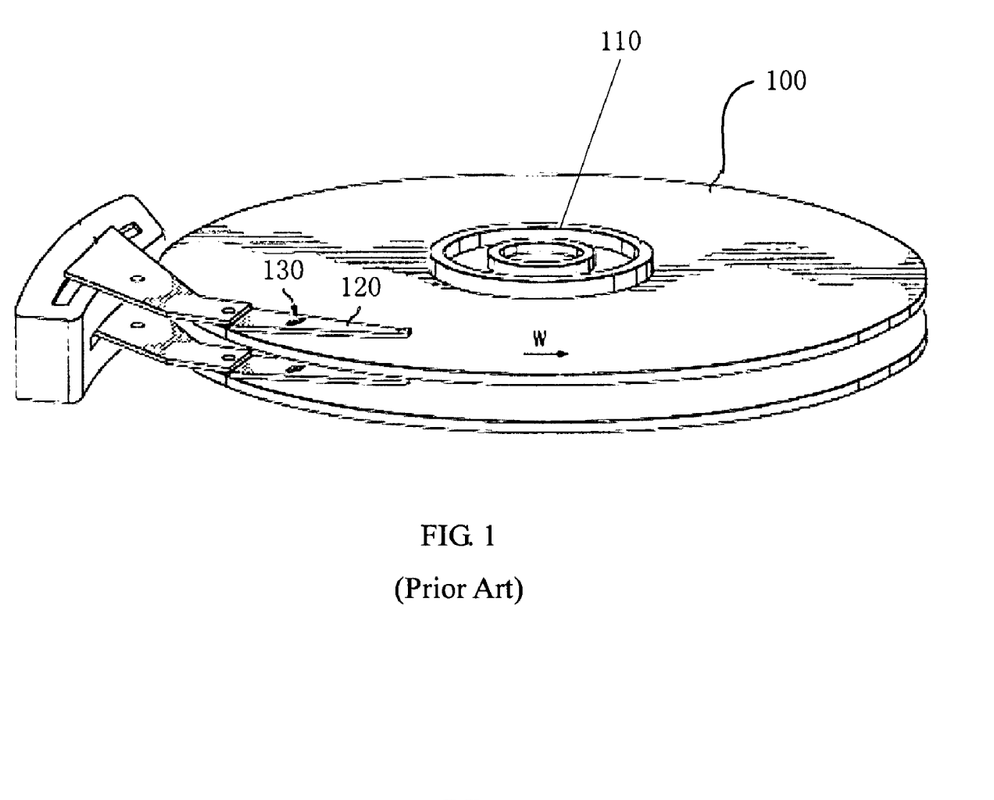
FIG. 1 is a perspective view of a traditional system for controlling flying height.
Figure 2:
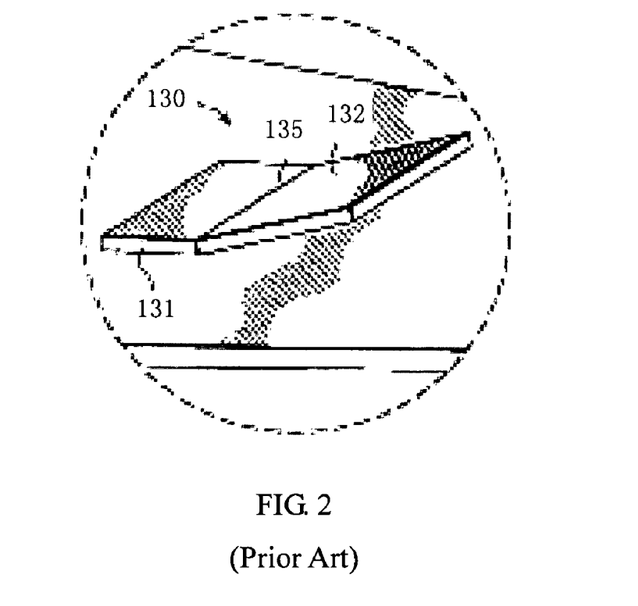
FIG. 2 is an enlarged, partial view of FIG. 1 to show a traditional flying height controller.

To achieve the above-mentioned requirement, U.S. Pat. No. 5,611,707 discloses an apparatus for controlling the dynamic flying height of the slider. Referring to FIG. 1, a disk drive comprises a magnetic disk 100 which rotates at a high speed about a spindle motor 110, and a head gimble assembly (HGA) 120 having a slider flying on the magnetic disk 100. A flying height controller 130 for controlling the dynamic flying height is mounted on the HGA 120. Referring to FIG. 2, the flying height controller 130 is consisted of a base 131 and a movable aerodynamic element 132. The movable aerodynamic element 132 can pivot about an edge 135 between the base 131 and the movable aerodynamic element 132. The movable aerodynamic element 132 can move from a closed position substantially parallel to the base 131 to an open position substantially perpendicular to the base 131. When in the closed position, the fly height controller 130 does not affect the control of flying height. While in the open position, the fly height controller 130 will depress the HGA 120 and accordingly reduce the flying height of the slider.

However, the flying height adjustment capability of the flying height controller 130 have a limitation, that is, it can only reduce the flying height, but can not increase the flying height. Actually, it is required to increase the flying height to compensate the fabrication variation of the slider and the HGA. In addition, because the flying height controller 130 is mounted on the HGA, it will increase the weight of the HGA and greatly influence the performance of the HGA 120, such as the resonance and the shock performance. Also, since the flying height controller 130 is far away from the slider, its adjustment accuracy is rather limited. Finally, because the flying height controller 130 has a complex structure, so it is rather costly and takes much time to manufacture such a flying height controller 130.

Hence it is desired to provide a method and system of adjusting flying height, and a HGA and disk drive which can overcome the foregoing drawbacks of the prior art.

SUMMARY OF THE INVENTION

A main feature of the present invention is to provide a HGA and a disk drive unit having a good flying height adjustment capability, and a method for flying height control using the HGA and disk drive.

A further feature of the present invention is to provide a system of dynamically adjusting flying height.

To achieve the above-mentioned features, a HGA of the present invention comprises a slider, a suspension to load the slider, a flying height controller for controlling flying height of the slider; and a flexible cable to be electrically connected with the slider and the flying height controller. In the present invention, the flying height controller comprises at least one piezoelectric piece disposed between the slider and the suspension. The HGA further comprises anisotropic conductive film to connect the flying height controller with the suspension and the flexible cable.

In the present invention, each of the at least one piezoelectric pieces is a thin film piezoelectric piece, ceramic piezoelectric piece or PMN-Pt piezoelectric piece, which is a single-layer piezoelectric piece or a multi-layer piezoelectric piece. In an embodiment, the at least one piezoelectric pieces are bonded on single side or both sides of the suspension at a suspension tongue area. In addition, at least one slots are formed in the suspension at the suspension tongue area.

A method for flying height control using the above-mentioned HGA, comprises the steps of: (1) rotating a disk, the disk storing information; (2) accessing the information by the slider; (3) exciting the flying height controller to control the height of the slider with respect to the disk as the disk rotates.

A disk drive unit of the present invention comprises a disk to store information and a HGA. The HGA comprises a slider flying on the disk, a suspension to load the slider, a flying height controller for controlling flying height of the slider; and a flexible cable to be electrically connected with the slider and the flying height controller.

A system of dynamically adjusting flying height of the invention comprises: (1) a servo control system to pick a position error signal (PES) and separate it into two channels of PES signals; (2) a VCM controller to receive one channel of PES signal for controlling a VCM driver to drive the VCM so as to adjust the position of the slider; (3) a flying height adjustment counter to receive the other channel of PES signal and calculate a required FH adjustment by comparing with a requirement signal of the servo control system, and then output a drive voltage; and (4) a PZT operation driver to receive the drive voltage and applied the drive voltage to a flying height controller to change the flying height of the slider.

Compared with the prior art, first, the present invention does not need to provide a complicated flying height controller on the HGA, so it is reduce the weight of the HGA and has not concern about the shock performance. Also, the other performance of the HGA, such as resonance, will not be influenced. In addition, because the flying height controller of the present invention is a PZT piece under the slider, so it is more accuracy for the flying height adjustment of the slider. Furthermore, this invention can adjust the flying height of the slider by any way according to the requirement. Obviously, the present invention is easy to perform and the cost is also cheaper than the prior art.

For the purpose of making the invention easier to understand, several particular embodiments thereof will now be described with reference to the appended drawings in which:

DETAILED DESCRIPTION OF THE INVENTION

Figure 3:
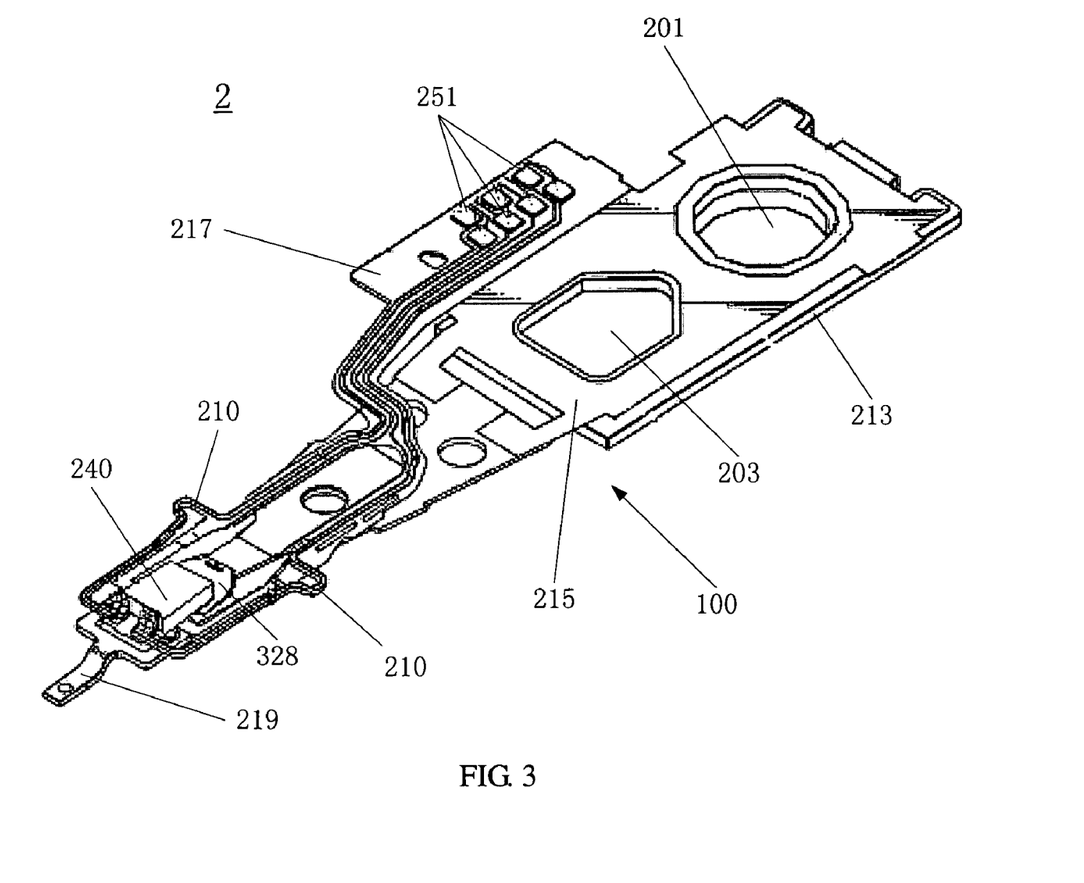
FIG. 3 is a perspective view of a HGA according to a first embodiment of the present invention.

Referring to FIG. 3, according to a first embodiment of the present invention, a head gimbal assembly (HGA) 2 comprises a slider 240, a flying height adjuster and a suspension 100.

Figure 4:
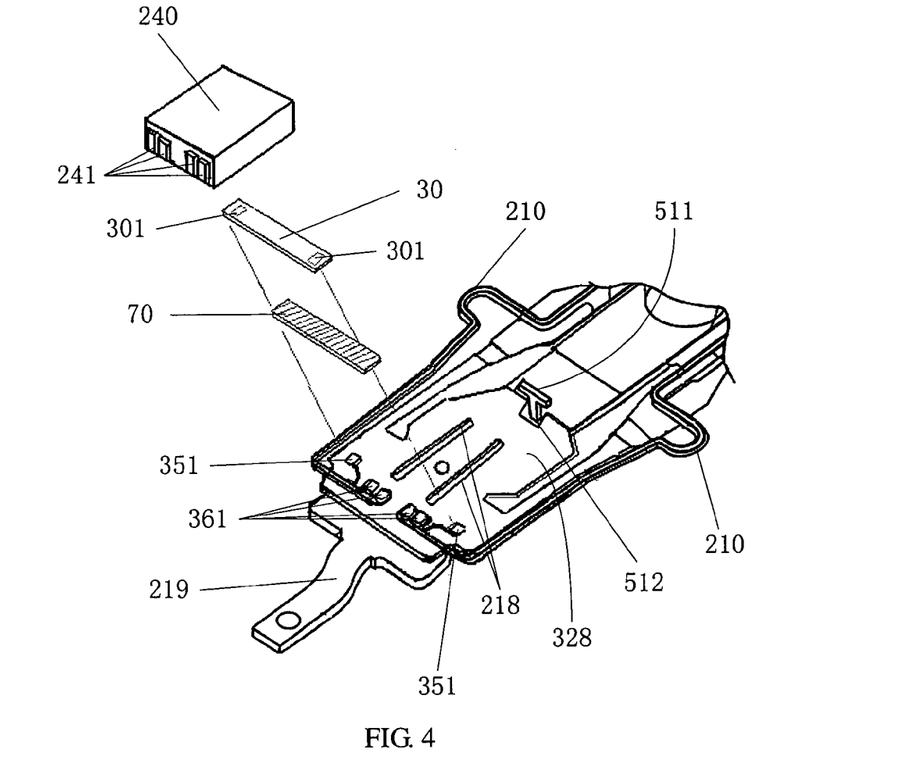
FIG. 4 is an exploded, enlarged, partial view of the HGA in FIG. 3.

Referring to FIGS. 3 and 4, the slider 240 is provided with a plurality of electrical pads 241 on one side thereof. The flying height adjuster is actually a piezoelectric (PZT) piece 30 which has two electrical pads 301 on both sides thereof. The suspension 100 comprises a load beam 219, a flexure 217, a hinge 215 and a base plate 213. As an embodiment, the flexure 217 is coupled with the hinge 215, the load beam 219 and the base plate 213 by laser welding. In the embodiment, the load beam 219 has one dimple 329 (see FIG. 6) and one limiter 511 provided thereon. Each of the hinge 215 and the base plate 213 forms two holes 201 and 203 therein. The hole 201 is used for swaging the HGA 2 and the drive arm (not shown), and the hole 203 is used to reduce the weight of the suspension 100. Also referring to FIGS. 3 and 4, a plurality of connection pads 251 are provided at one end of the flexure 217 to connect with a control system (not shown) and a plurality of electrical pads 351, 361 are provided in the other end of the flexure 217. Said connection pads 251 are connected with the electrical pads 351, 361 by a plurality of electrical multi-traces 210 therebetween. In the embodiment, the flexure 217 also comprises a suspension tongue 328 which are used to support the slider 240 and keep the loading force always being applied to the center area of the slider 240 through the dimple 329 of the load beam 219 (see FIG. 6). In the embodiment, the suspension tongue 328 has two electrical pads 351 disposed on a predetermined position corresponding to the electrical pads 301 on the PZT piece 30. Also, there are a plurality of electrical pads 361 on the suspension tongue 328 corresponding to the electrical pads 241 of the slider 240.

Figure 7:
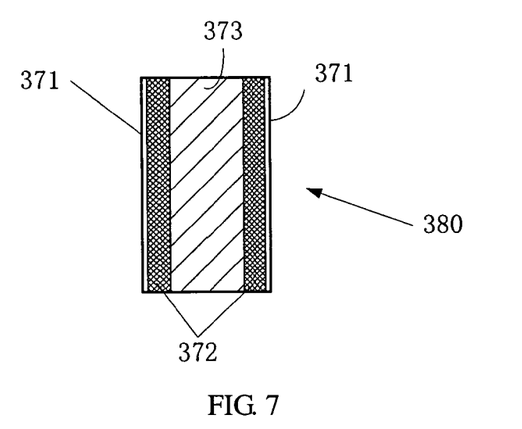
FIG. 7 is a cross-sectional view of a PZT piece according to an embodiment of the present invention.
Figure 8:
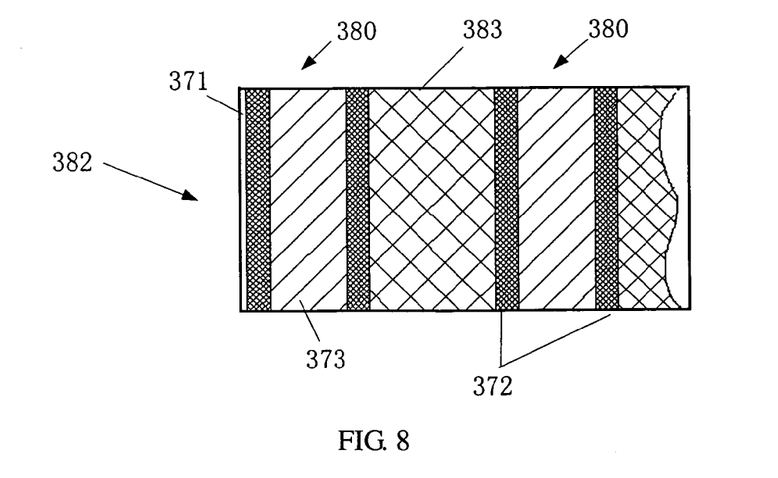
FIG. 8 is a cross-sectional view of the PZT piece according to another embodiment of the present invention.

Referring to FIGS. 7 and 8, in the present invention, the PZT piece 30 can be a single-layer PZT piece 380 or a multi-layer PZT piece 382. In an embodiment, the single-layer PZT piece 380 comprises a PZT layer 373, two electric layers 372 and two substrate layers 371. The PZT layer 373 is sandwiched between the two electric layers 372. Two substrate layers 371 are used for supporting and protecting the PZT layer 373 and the electric layers 372. In the present invention, the single-layer PZT piece 380 may thin film PZT piece, ceramic PZT piece, or PMN-Pt piezoelectric piece. The thickness of the PZT layer 373 may be 1~3 µm, the thickness of each of the electric layers 372 may be less than 1 µm and the thickness of the substrate layer 371 may be between 0.1 µm and several microns. Thus the total thickness of the single-layer PZT piece 380 is very thin. In the present invention, the multi-layer PZT piece 382 comprises two or more single-layer PZT pieces 380 (without substrate layer 371) which are coupled together, and two substrate layers 371 to enclose the single-layer PZT pieces 380. Every two single-layer PZT pieces 380 of the multi-layer PZT piece 382 are coupled with each other by epoxy or resin 383. Understandably, this is going to increase the bending performance of the PZT piece 30 which is not only help to change the slider camber (width curvature of a slider is known as slider camber), but also make the adjustment of the slider camber and flying height more easier. In a preferred embodiment, the thickness of the epoxy or resin 383 for bonding single-layer PZT pieces 380 may be less than 5 µm, this will keep the PZT piece 30 still very thin but with a good adjustment character.

Referring to FIG. 4, two slots 218 are formed in the suspension tongue 328 for reducing the stiffness of the suspension tongue 328. This configuration can achieve a good flying height adjustment capability when the PZT piece 30 is bent. Also, an opening 512 is provided in the suspension tongue 328 corresponding to the limiter 511 of the load beam 219. Said limiter 511 extends through the opening 512 for preventing an excessive movement of the suspension tongue 328.

Figure 5:
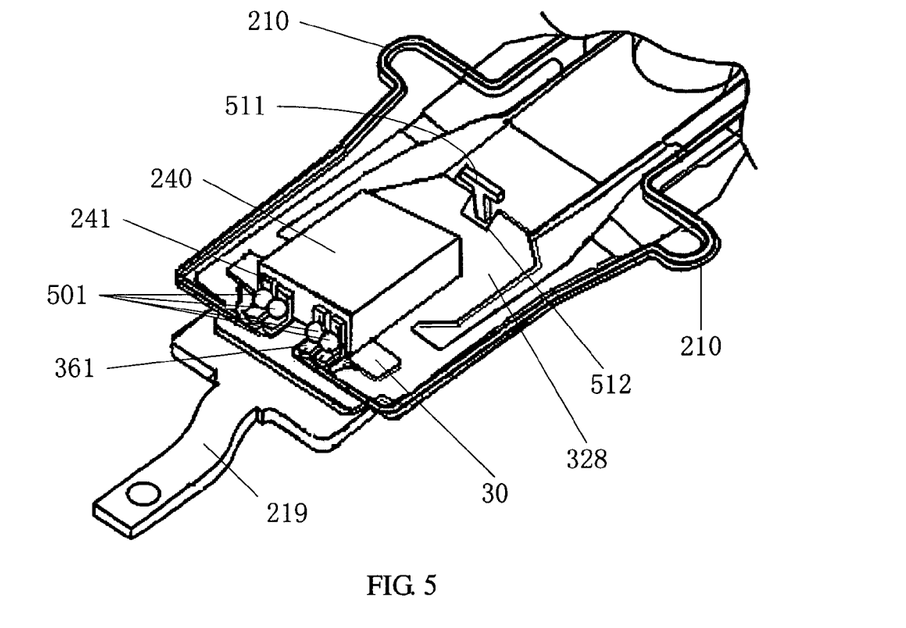
FIG. 5 is an enlarged, partial view of the assembled HGA in FIG. 3.
Figure 6:
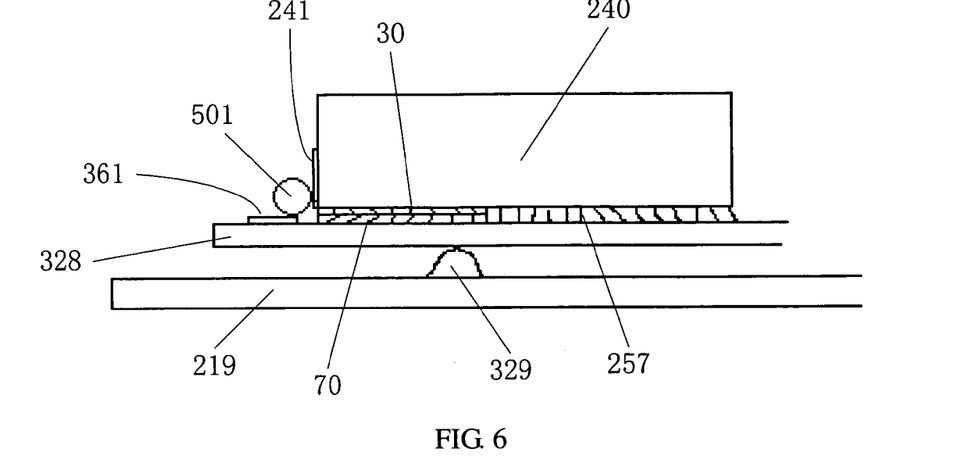
FIG. 6 is a cross-sectional view of the HGA in FIG. 3 in the micro-actuator area.

In the embodiment, also referring to FIG. 4, during assembly, firstly, the PZT piece 30 is bonded to the suspension tongue 328 by an ACF piece 70, accordingly, the two electrical pads 351 of the suspension tongue 328 is electrically connected with the electrical pads 301 on the PZT piece 30 so as to establish an electrical connection between the suspension tongue 328 and the PZT piece 30. Then, the slider 240 is positioned on the suspension tongue 328 and thus the PZT piece 30 is sandwiched between the slider 240 and the suspension tongue 328. In the present invention, the slider 240 is partially bonded to the suspension tongue 328 by epoxy or adhesive 257 (referring to FIG. 6). Also, the slider 240 is electrically connected with the suspension tongue 328 by bonding the electrical pads 361 of the suspension tongue 328 with the electrical pads 241 of the slider 240 through a plurality of metal balls 501 (gold ball bonding or solder bump bonding, GBB or SBB). Thus, the HGA 2 is formed, as shown in FIGS. 5 and 6.

Figure 9A:
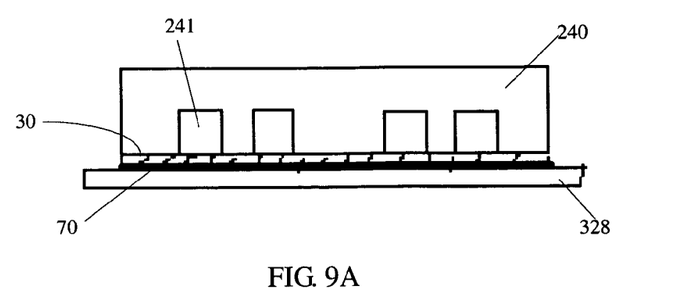
FIGS. 9A-9C shows three different working status of the PZT piece of the present invention according to an embodiment of the present invention.
Figure 9B:
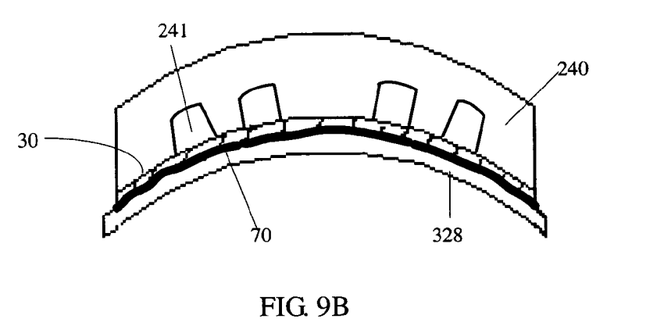
Figure 9C:
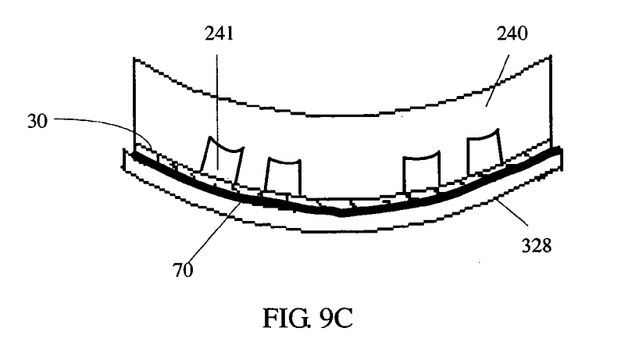
Figure 10A:
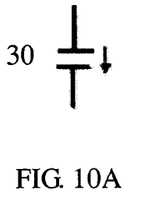
FIGS. 10A, 10B, 11A, 11B shows two different voltages applied to the PZT piece.
Figures 10B, 11A:
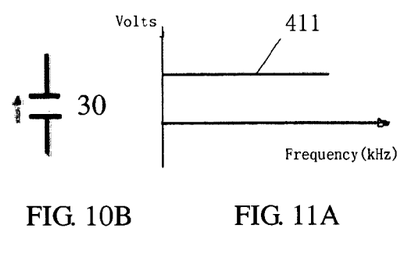
Figure 11B:
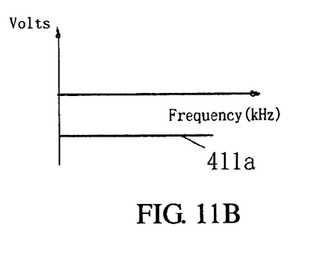

FIGS. 9A-9C give a detail illustration of the working principle of the PZT piece 30. When no voltage is applied to the PZT piece 30, the PZT piece 30 stays it original position and the slider 240 keeps its original profile, as shown in FIG. 9A. Referring to FIGS. 10A and 11A, when a positive DC voltage 411 is applied to the PZT piece 30 with positive polarization, the PZT piece 30 with positive polarization will be bent due to Weiss domain effect. Then, the profile of the slider 240 (mainly the slider camber) will become positive under the positive action of the PZT piece 30 with positive polarization because the PZT piece 30 with positive polarization is sandwiched between the slider 240 and the suspension tongue 328 while the suspension tongue 328 has a lower stiffness, as shown in FIG. 9B. Contrarily, referring to FIG. 11B, when a negative DC voltage 411a is applied to the PZT piece 30 with positive polarization, the profile of the slider 240 (mainly the slider camber) will become negative under the negative action of the PZT piece 30 with positive polarization, as shown in FIG. 9C. Referring FIGS. 10B and 11A, when a positive DC voltage 411 is applied to the PZT piece 30 with negative polarization, the PZT piece 30 with negative polarization will be bent due to Weiss domain effect. Then, the profile of the slider 240 (mainly the slider camber) will become negative under the positive action of the PZT piece 30 with negative polarization because the PZT piece 30 with negative polarization is sandwiched between the slider 240 and the suspension tongue 328 while the suspension tongue 328 has a lower stiffness, as shown in FIG. 9C. Contrarily, referring to FIG. 11B, when a negative DC voltage 411a is applied to the PZT piece 30 with negative polarization, the profile of the slider 240 (mainly the slider camber) will become positive under the negative action of the PZT piece 30 with negative polarization, as shown in FIG. 9B.

Figure 12A:
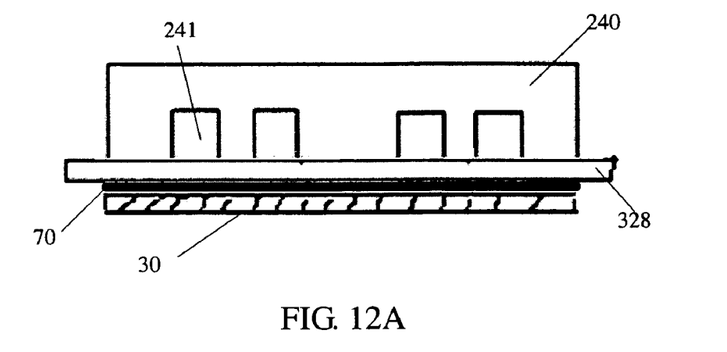
FIGS. 12A-12C shows three different working status of the PZT piece of the present invention according to another embodiment of the present invention.
Figure 12B:
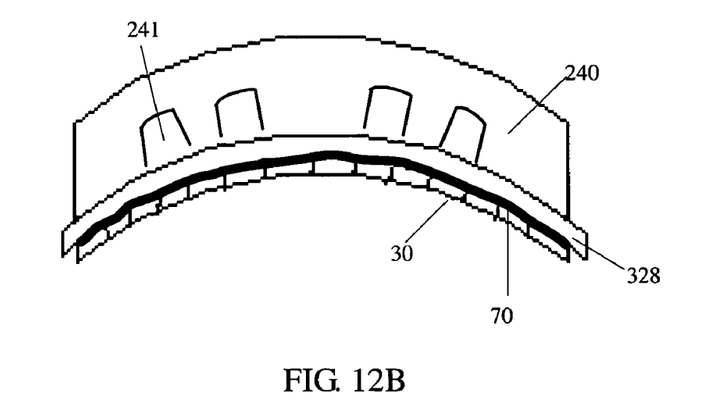
Figure 12C:
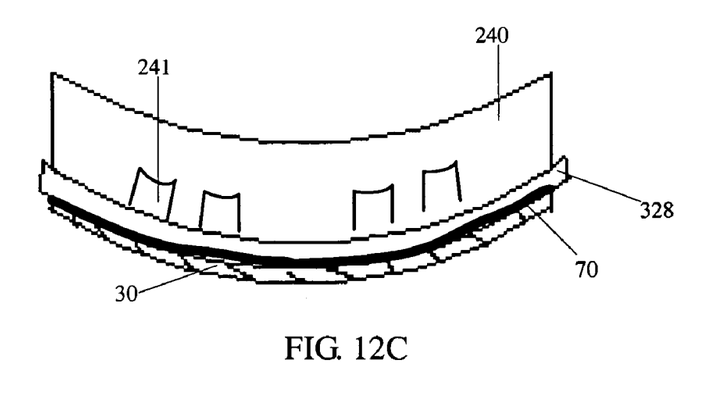

In another embodiment, as shown in FIGS. 12A-12C, the PZT piece 30 may be mounted on the back side of the suspension tongue 328. In this way, the slider 240 is directly positioned on one side of the suspension tongue 328 while the PZT piece 30 is bonded on the other side of the suspension tongue 328. Similarly, when no voltage is applied to the PZT piece 30, the PZT piece 30 stays it original position and the slider 240 keeps its original profile, as shown in FIG. 12A. When a positive DC voltage is applied to the PZT piece 30 with positive polarization, the PZT piece 30 with positive polarization will be bent due to Weiss domain effect. Then, the profile of the slider 240 (mainly the slider camber) will become positive under the positive action of the PZT piece 30 with positive polarization because the PZT piece 30 with positive polarization is mounted on the back side of the suspension tongue 328 while the slider 240 is mounted on the positive side of the suspension tongue 328 and the suspension tongue 328 has a lower stiffness, as shown in FIG. 12B. Contrarily, when a negative DC voltage is applied to the PZT piece 30 with positive polarization, the profile of the slider 240 (mainly the slider camber) will become negative under the negative action of the PZT piece 30 with positive polarization, as shown in FIG. 12C. Similarly, if the PZT piece 30 has a negative polarization, the working principle is same as the above-mentioned principle so as to be omitted herefrom. In another embodiment of this invention, there are two or more PZT pieces 30 which are mounted on single side or both sides of the suspension tongue 328, this will enhance the capacity to adjust the profile of the slider 240 (mainly the slider camber), and accordingly enhance the capability to adjust the flying height of the slider 240.

Figure 13:
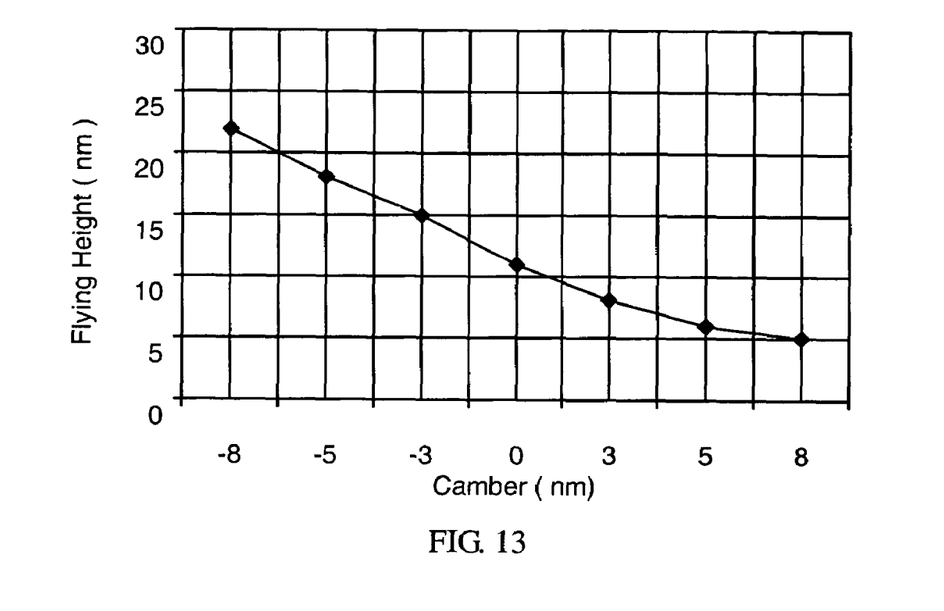
FIG. 13 shows a relationship between flying height of the slider and camber of the slider.

FIG. 13 illustrates a relationship between the camber of the slider 240 and the flying height of the slider 240 according to an embodiment of the present invention. It shows that a higher camber will result in a lower flying height.

Figure 14:
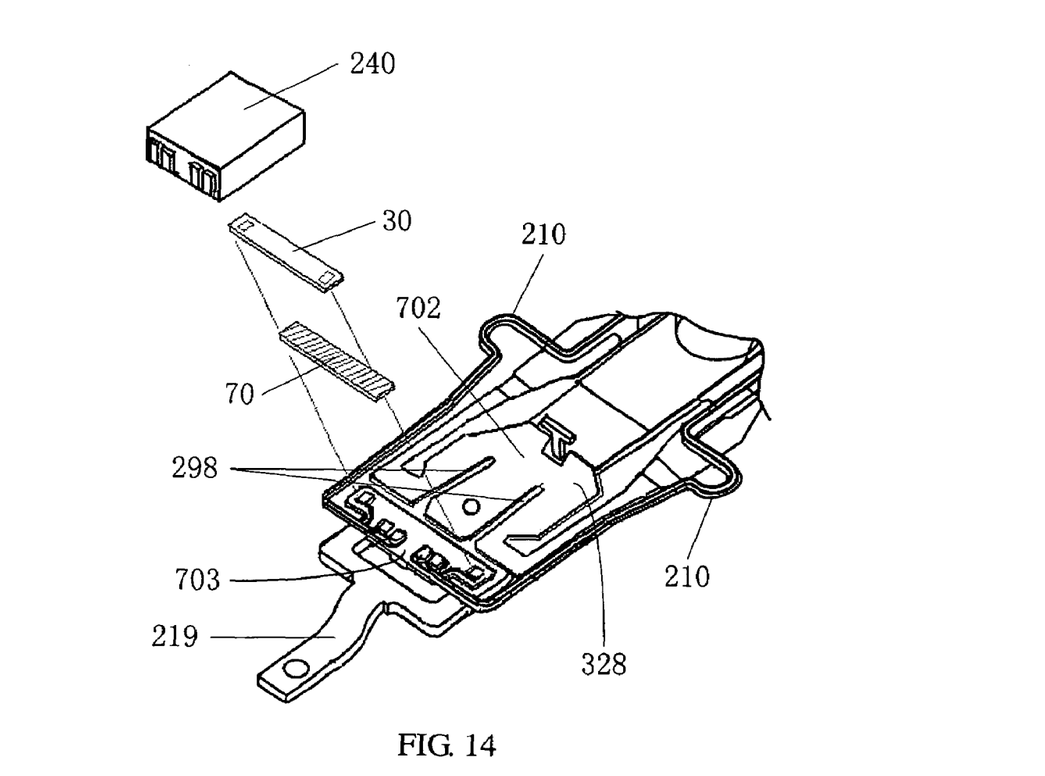
FIG. 14 is an exploded, enlarged, partial view of a HGA according to a second embodiment of the present invention.

In another embodiment of the HGA of the present invention, referring to FIG. 14, the suspension tongue 328 is separated into two parts, one is moving part 703 and the other is steady part 702. Two narrow cuts 298 are formed in the steady part 702, and the dimple 329 (see FIG. 16) of the load beam 219 is positioned between the two narrow cuts 298 to support the steady part 702.

Figure 15:
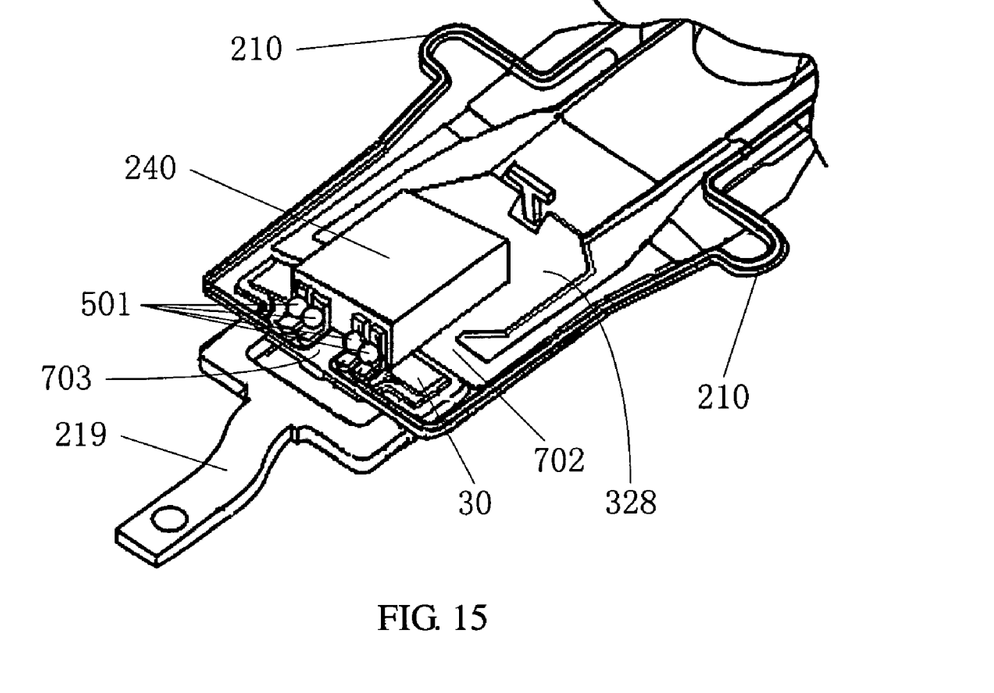
FIG. 15 is a partial view of the assembled HGA in FIG. 14.
Figure 16:
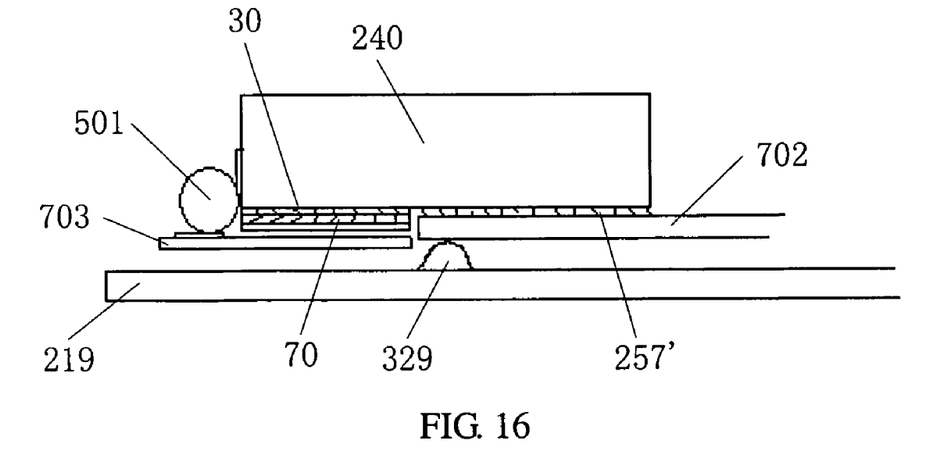
FIG. 16 is a cross-sectional view of the HGA in FIG. 14 in the micro-actuator area.

Referring to FIGS. 14-16, during assembly, firstly, the PZT piece 30 is bonded to the moving part 703 of the suspension tongue 328 by the ACF piece 70. Then, the slider 240 is positioned on the suspension tongue 328 and thus the PZT piece 30 is sandwiched between the suspension tongue 328 and the slider 240. In the embodiment, the slider 240 is partially bonded to the steady part 702 of the suspension tongue 328 by epoxy or adhesive 257'. Similarly, an electrical connection among the slider 240, the suspension tongue 328 and the PZT piece 30 through metal balls 501 and the ACF piece 70 is established after such assembly.

Figure 17:
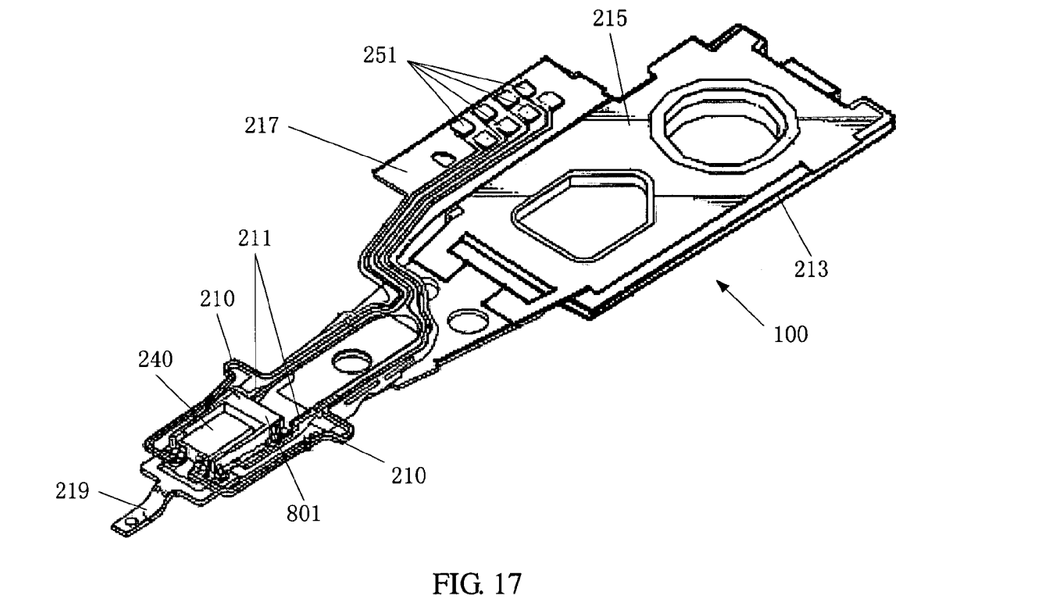
FIG. 17 is a perspective view of a HGA according to a third embodiment of the present invention.
Figure 18:
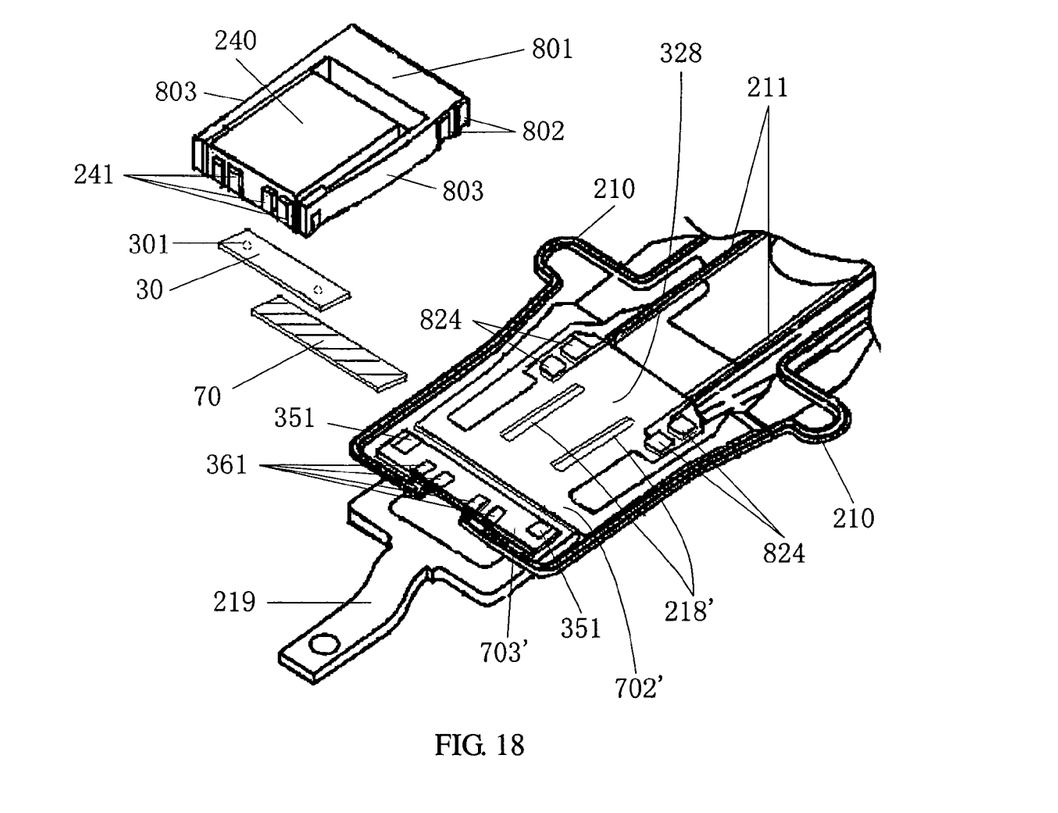
FIG. 18 is an exploded, enlarged, partial view of the HGA in FIG. 17.

In a further embodiment of the HGA of the present invention, referring to FIGS. 17-18, the HGA further comprises a ceramic U-shaped frame 801 with two PZT pieces 803 on both sides thereof besides the PZT piece 30 with two electrical pads 301. The slider 240 is mounted in the U-shaped frame 801 with the four electrical pads 241 exposed outwardly. The two PZT pieces 803 may two thin film PZT pieces or ceramic PZT pieces. Each of the two PZT pieces 803 is provided with two electrical pads 802. The suspension tongue 328 is separated into two parts, one is moving part 703' and the other is steady part 702'. Two narrow slots 218' are formed in the steady part 702' for reducing the stiffness of the suspension tongue 328. On the suspension tongue 328 there are provided a plurality of electrical pads 824 on the steady part 702' corresponding to the electrical pads 802, and a plurality of electrical pads 351 and 361 are also provided corresponding to the electrical pads 301 and 241. In addition, the connection pads 251 are provided on the flexure 217 to connect with the control system (not shown) at one end and a plurality of electric multi-traces 210, 211 in the other end. Through the electric multi-traces 210, 211, the connection pads 251 electrically connect the slider 240, the PZT piece 30 and the two PZT pieces 803 with the control system (not shown).

In the embodiment, firstly, the PZT piece 30 is electrically and physically coupled with the moving part 703' of the suspension tongue 328 by the ACF piece 70, accordingly, the electrical pads 301 are connected with the electrical pads 351. Then, the U-shaped frame 801 is partially coupled with the suspension tongue 328, and there are a plurality of metal balls (gold ball bonding or solder bump bonding, GBB or SBB, not labeled) to connect the electrical pads 824, 351 with the electrical pads 802, 804 so as to electrically connect the two PZT pieces 803 with the electric traces 211. In addition, there are a plurality of metal balls (GBB or SBB, not labeled) to connect the electrical pads 241 with the electrical pads 361 so as to electrically connect the slider 240 with the suspension tongue 328.

When power supply is applied to the PZT pieces 803 through the electric traces 211, the PZT pieces 803 can expand or contract to cause the U-shaped frame 801 to deform and then make the slider 240 rotate along a radial direction on a magnetic disk so as to attain a fine position adjustment. When power supply is applied to the PZT piece 30 through the electric traces 210, the PZT piece 30 can cause the change of the profile (mainly the camber of the slider) of the slider 240 and thus attain a good flying height adjustment.

Figure 19:
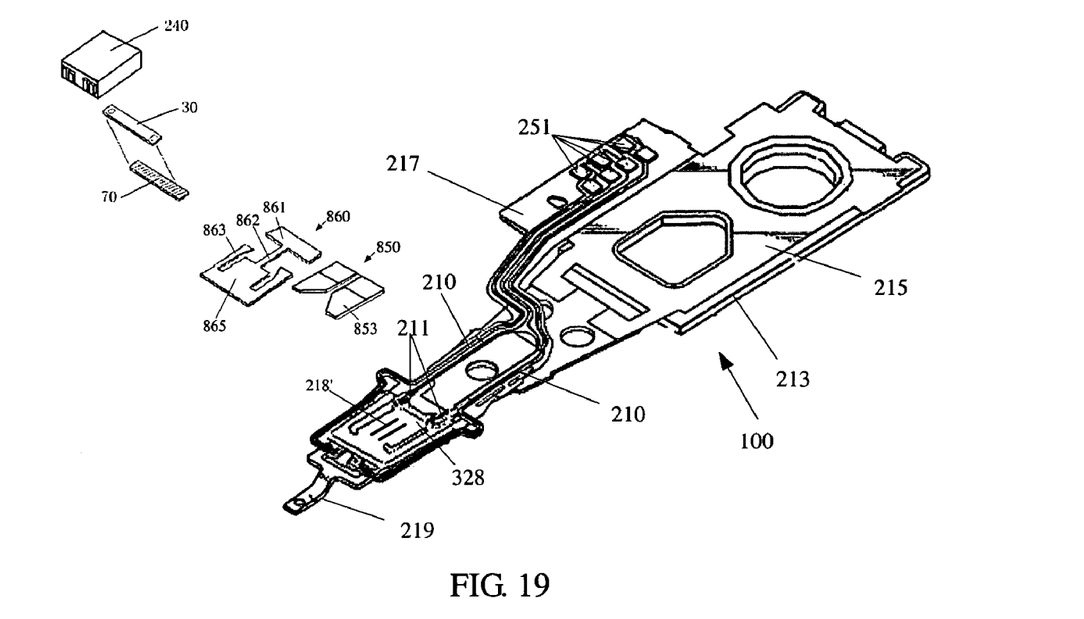
FIG. 19 is a perspective view of a HGA according to a fourth embodiment of the present invention.
Figure 20:
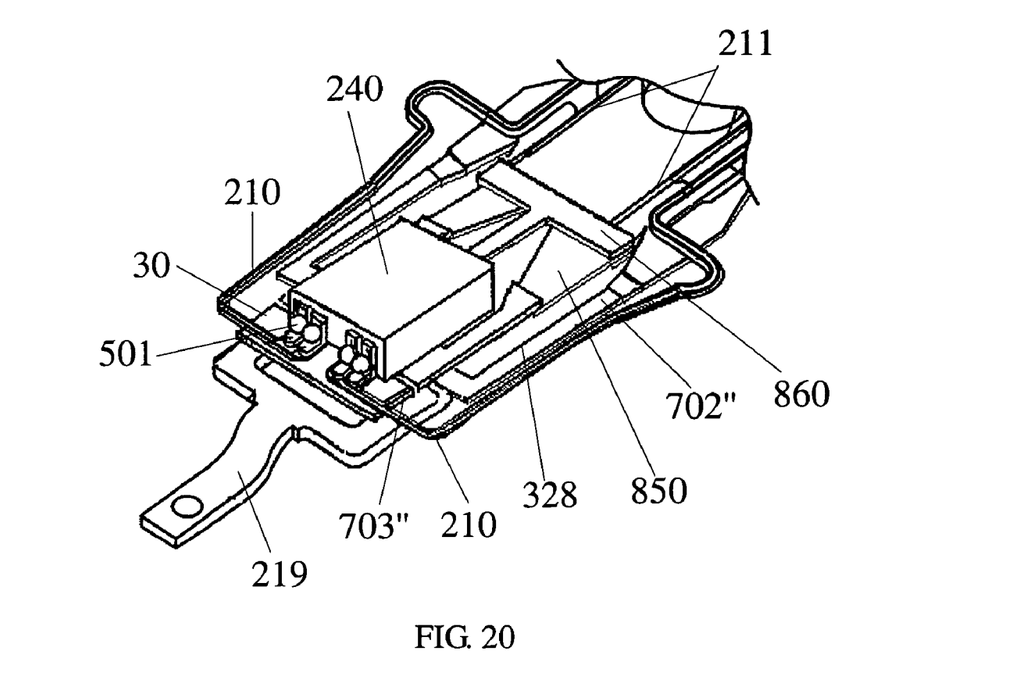
FIG. 20 is an enlarged, partial view of the HGA in FIG. 19.
Figure 21:
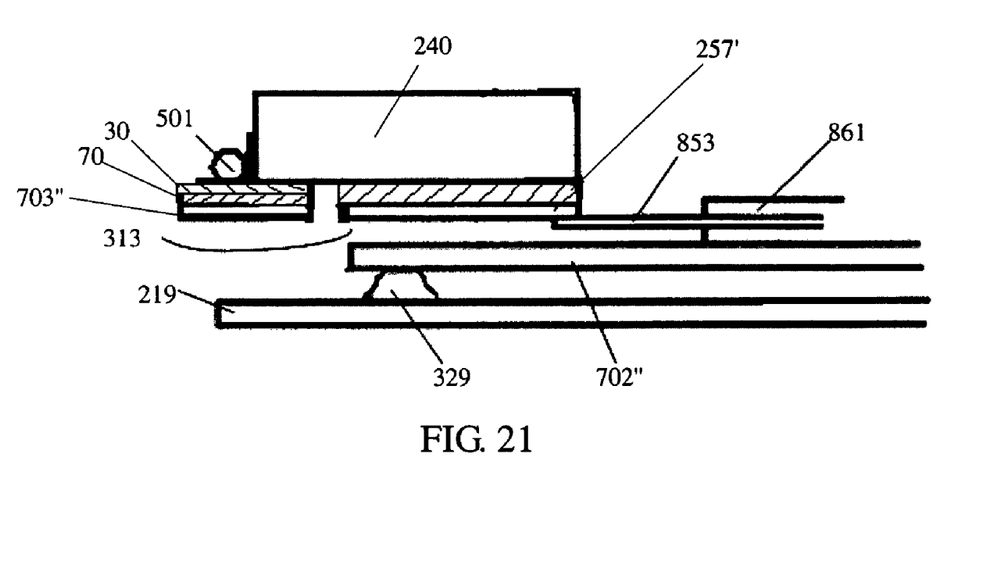
FIG. 21 is a cross-sectional view of the HGA in FIG. 19 in the micro-actuator area.

In a fourth embodiment of the HGA of the present invention, referring to FIGS. 19-21, the ceramic U-shaped frame 801 with two PZT pieces 803 may be replaced by a metal support base 860 and a piezoelectric (PZT) unit 850. The PZT unit 850 comprises two thin film PZT pieces 853 (also can be ceramic PZT pieces) and a plurality of electrical pads (not shown) on one side thereof. The support base 860 comprises a base 861, a leading beam 862, and a moving plate 865 with two side beams 863 in its both sides. In an embodiment of the invention, the width of the leading beam 862 is narrower than that of the moving plate 865. The PZT unit 850 physically couples with the support base 860 by traditional method, such as adhesive bonding. The suspension tongue 328 of the suspension 100 is separated into two parts, one is moving part 703" and the other is steady part 702". Two narrow slots 218' are formed in the steady part 702" for reducing the stiffness of the suspension tongue 328, and the dimple 329 (see FIG. 21) of the load beam 219 is positioned between the two narrow slots 218' to support the steady part 702".

Also referring to FIGS. 19-21, in the present invention, after the PZT unit 850 is bonded with the support base 860 to form an additional micro-actuator, the additional micro-actuator are electrically and physically coupled with the steady part 702" of the flexure 217 by anisotropic conductive film (ACF). A parallel gap 313 is thus formed between the additional micro-actuator and the suspension tongue 328 so as to ensure the smooth movement of the additional micro-actuator. Then, the PZT piece 30 is bonded to the moving part 703" of the suspension tongue 328 by the ACF piece 70. After that, the slider 240 is positioned on the PZT piece 30 and the additional micro-actuator, and then partially couples the moving plate 865 of the support base 860 physically and electrically by ACF or adhesive 257'. The physical coupling can keep the slider 240 moving together with the additional micro-actuator and the electrical coupling help to prevent electro static discharge (ESD) damage of the slider 240.

In the embodiment, four metal balls 501 (GBB or SBB) are used to electrically connects the slider 240 with the two electric multi-traces 210. The PZT unit 850 on the suspension tongue 328 electrically connects with the electric multi-traces 211 through the electrical pads thereon by ACF or conductive adhesive. Through the electric multi-traces 210, 211, the connection pads 251 electrically connect the slider 240, the PZT piece 30 and the additional micro-actuator with the control system (not shown). When power supply is applied to the PZT unit 850 through the electric traces 211, the PZT unit 850 can expand or contract to cause the support base 860 to deform and then make the slider 240 rotate along a radial direction on a magnetic disk so as to attain a fine position adjustment. When power supply is applied to the PZT piece 30 through the electric traces 210, the PZT piece 30 can cause the change of the profile (mainly the camber of the slider) of the slider 240 and thus attain a flying height adjustment.

Figure 22:
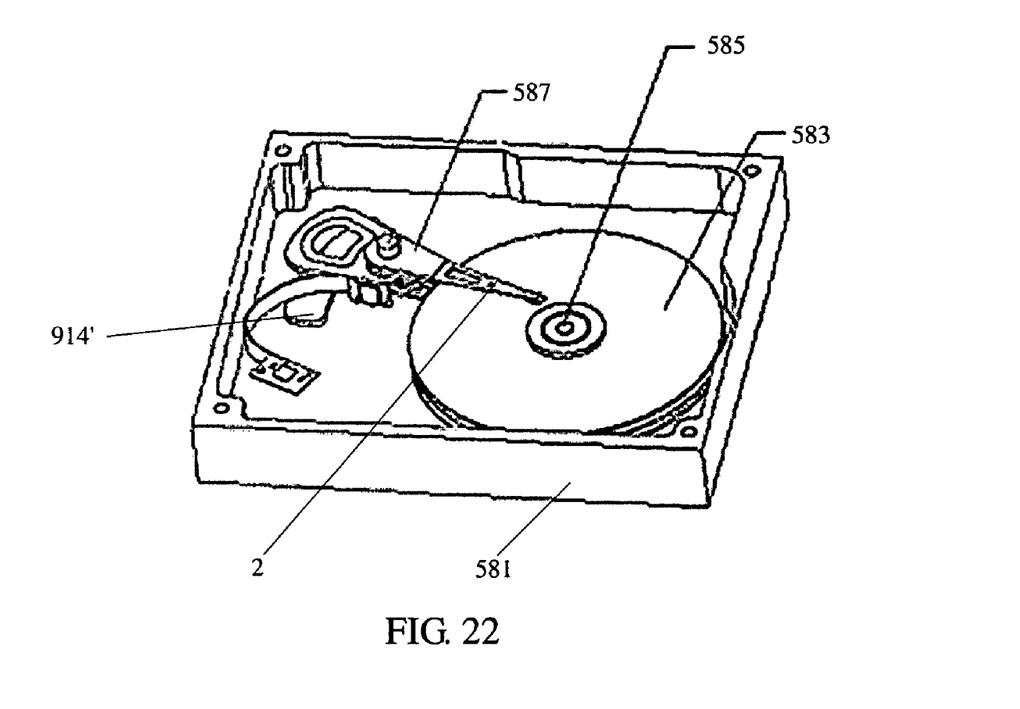
FIG. 22 is a perspective view of a disk drive unit of the present invention.

In the present invention, after assembly of the HGA 2, the HGA 2 is secured with a drive arm 587, and then put into and secured with a base plate 581. Other essential parts, such as disk 583, spindle motor 585 and VCM 914', are also mounted into the base plate 581. Thus a disk drive unit is formed, as shown in FIG. 22.

A method for flying height control using the HGA of the present invention comprises the steps of: (1) rotating the disk 583, the disk 583 storing information; (2) accessing the information by the slider 240; (3) exciting the PZT piece 30 to control the height of the slider 240 with respect to the disk 583 as the disk 583 rotates.

Figure 23:
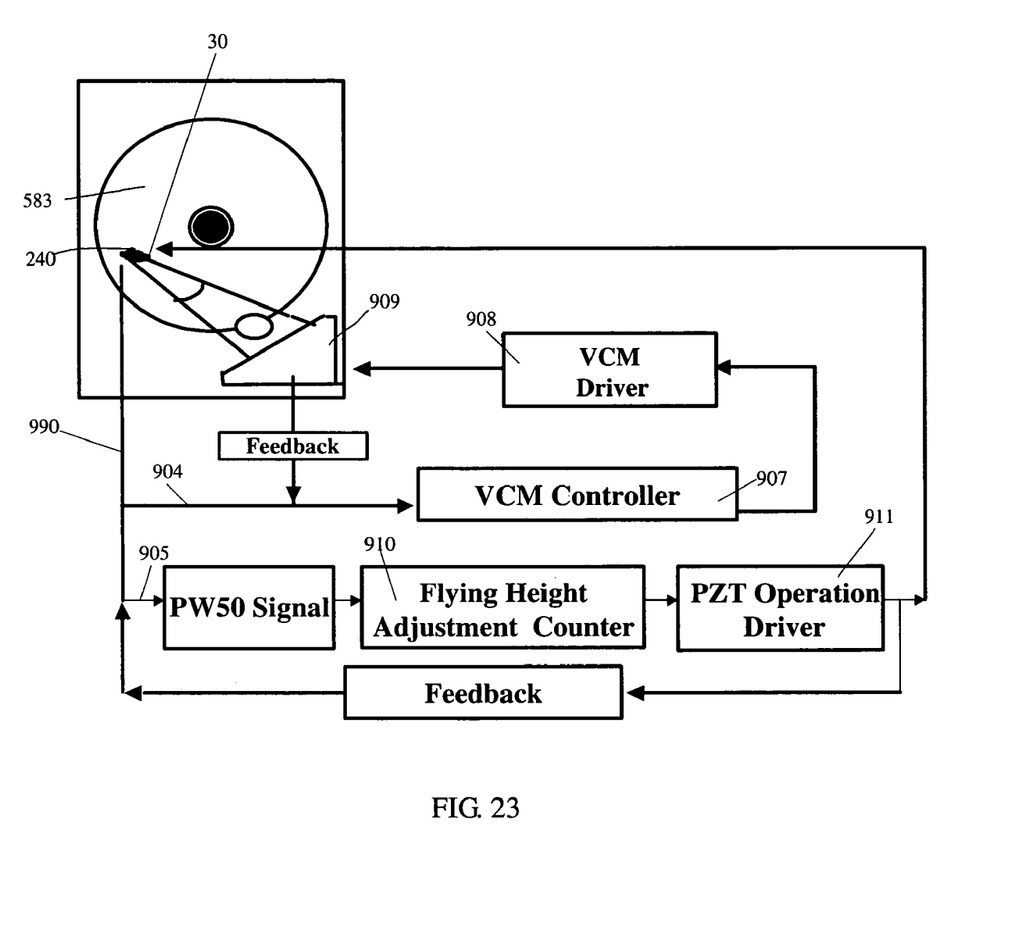
FIG. 23 is a system of dynamically adjust flying height according to the present invention.

FIG. 23 shows an electric control circle for the flying height adjustment of the disk drive unit according to the present invention. The slider 240 is flying on the disk 583 to read information from or write information to the disk 583, a position error signal (PES) is picked by a servo control system (not shown) and separated into two channels of signals, signal 904 and signal 905. The signal 904 is sent to a VCM controller 907 to control a VCM driver 908. The VCM driver 908 is controlled to drive or adjust the VCM 909 so as to adjust the position of the slider 240. The signal 905 is converted to PW50 (50% width of amplitude) signal and then sent to a flying height adjustment counter 910. The flying height adjustment counter 910 will calculate a required FH adjustment by comparing with the requirement PW50 signal of the servo control system (not shown), and then output a drive voltage which can cause the PZT piece 30 deform so as to change the flying height of the slider 240. The drive voltage will be sent to the PZT operation driver 911 subsequently and applied to the PZT piece 30 to do a final flying height adjustment.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A head gimbal assembly comprising:
   a slider;
   a suspension to load the slider;
   a flying height controller for adjusting a camber of the slider at an end portion of the slider, wherein the flying height controller is mounted only under the end portion of the slider;
   a flexible cable to be electrically connected with the slider and the flying height controller; and
   at least one substantially linear slot encompassed within a tongue of the suspension, the at least one slot extending substantially longitudinally with respect to the tongue and being arranged such that a widthwise direction of the slot is parallel to an extension-contraction direction of the flying height controller so as to reduce stiffness of the tongue so that the tongue having the reduced stiffness can cooperate with the flying height controller in adjusting the camber of the slider.

2. The head gimbal assembly as claimed in claim 1, wherein the flying height controller comprises at least one piezoelectric piece disposed between the slider and the suspension.

3. The head gimbal assembly as claimed in claim 1, further comprising anisotropic conductive film to connect the flying height controller with the suspension and the flexible cable.

4. The head gimbal assembly as claimed in claim 2, wherein each of the at least one piezoelectric pieces is a thin film piezoelectric piece, ceramic piezoelectric piece or PMN-Pt piezoelectric piece.

5. The head gimbal assembly as claimed in claim 2, wherein each of the at least one piezoelectric pieces is a single-layer piezoelectric piece or a multi-layer piezoelectric piece.

6. The head gimbal assembly as claimed in claim 2, wherein the at least one piezoelectric pieces are bonded on a single side or on both sides of the suspension at the tongue.

7. A method for flying height control using the head gimbal assembly of claim 1, comprising the steps of:
rotating a disk, the disk storing information;
accessing the information by the slider;
exciting a flying height controller located only under an end portion of the slider to adjust the camber of the slider, at the end portion of the slider, with respect to the disk as the disk rotates.

8. The method of claim 7, wherein the flying height controller is at least one piezoelectric piece disposed between the slider and the suspension.

9. The method of claim 7, wherein anisotropic conductive film is used to connect the flying height controller with the suspension and a flexible cable.

10. A disk drive unit comprising:
a disk to store information; and
a head gimbal assembly; wherein the head gimbal assembly comprises a slider flying on the disk;
a suspension to load the slider;
a flying height controller for adjusting a camber of the slider at an end portion of the slider, wherein the flying height controller is mounted only under the end portion of the slider;
a flexible cable to be electrically connected with the slider and the flying height controller; and
at least one substantially linear slot encompassed within a tongue of the suspension, the at least one slot extending substantially longitudinally with respect to the tongue and being arranged such that a widthwise direction of the slot is parallel to an extension-contraction direction of the flying height controller so as to reduce stiffness of the tongue so that the tongue having the reduced stiffness can cooperate with the flying height controller in adjusting the camber of the slider.

11. The disk drive unit according to claim 10, wherein the flying height controller comprises at least one piezoelectric piece disposed between the slider and the suspension.

12. The disk drive unit according to claim 10, further comprising an anisotropic conductive film to connect the flying height controller with the suspension and the flexible cable.

13. A system of dynamically adjusting flying height, comprising:
a servo control system to pick a position error signal (PES) and separate it into two channels of PES signals;
a voice coil motor (VCM) controller to receive one channel of PES signal for controlling a VCM driver to drive the VCM so as to adjust the position of a slider;
a flying height adjustment counter to receive the other channel of PES signal and calculate a required flying height adjustment by comparing with a requirement signal of the servo control system, and then output a drive voltage;
a piezoelectric operation driver to receive the drive voltage and apply the drive voltage to a flying height controller to adjust a camber of the slider at an end portion of the slider, wherein the flying height controller is mounted only under the end portion of the slider; and
at least one substantially linear slot encompassed within a tongue of a suspension, the at least one slot extending substantially longitudinally with respect to the tongue and being arranged such that a widthwise direction of the slot is parallel to an extension-contraction direction of the flying height controller so as to reduce stiffness of the tongue so that the tongue having the reduced stiffness can cooperate with the flying height controller in adjusting the camber of the slider in accordance with the PES signal.

* * * * *